(12) United States Patent
Blednov

(10) Patent No.: US 8,228,123 B2
(45) Date of Patent: Jul. 24, 2012

(54) INTEGRATED DOHERTY AMPLIFIER

(75) Inventor: Igor Blednov, Nijmegen (NL)

(73) Assignee: NXP B.V., Eindhoven (NL)

(*) Notice: Subject to any disclaimer, the term of this patent is extended or adjusted under 35 U.S.C. 154(b) by 203 days.

(21) Appl. No.: 12/674,906

(22) PCT Filed: Aug. 21, 2008

(86) PCT No.: PCT/IB2008/053382
§ 371 (c)(1),
(2), (4) Date: Feb. 24, 2010

(87) PCT Pub. No.: WO2009/027916
PCT Pub. Date: Mar. 5, 2009

(65) Prior Publication Data
US 2011/0204980 A1    Aug. 25, 2011

(30) Foreign Application Priority Data
Aug. 29, 2007 (EP) .................................... 07115222

(51) Int. Cl.
*H03F 3/68* (2006.01)
(52) U.S. Cl. .............. 330/295; 330/124 R; 330/307
(58) Field of Classification Search ............ 330/295, 330/124 R, 307
See application file for complete search history.

(56) References Cited

U.S. PATENT DOCUMENTS

| | | | |
|---|---|---|---|
| 6,252,461 B1 | 6/2001 | Raab | |
| 6,356,149 B1 | 3/2002 | Stengel et al. | |
| 6,396,341 B1 * | 5/2002 | Pehlke | 330/10 |
| 7,078,976 B2 * | 7/2006 | Blednov | 330/286 |
| 7,646,248 B2 * | 1/2010 | Yang et al. | 330/295 |
| 7,884,668 B2 * | 2/2011 | Blednov | 330/124 R |
| 2005/0231286 A1 | 10/2005 | Gotou et al. | |

FOREIGN PATENT DOCUMENTS

| | | |
|---|---|---|
| WO | 2004/017512 A1 | 2/2004 |
| WO | 2006/003608 A1 | 1/2006 |
| WO | 2006/006119 A1 | 1/2006 |
| WO | 2006/016299 A1 | 2/2006 |

OTHER PUBLICATIONS

International Search Report for International Patent Application PCT/IB2008/053382 (Feb. 23, 2009), Published As WO2009/027916A3.

* cited by examiner

*Primary Examiner* — Patricia Nguyen

(57) ABSTRACT

The invention relates to an integrated Doherty amplifier with an input network connecting the input to the main stage and to the peak stage, and with an output network connecting the main stage and the peak stage to the output. The output network has a shunt capacitor to signal-ground in parallel to a parasitic capacitance of the main stage, and has a shunt inductor between the main stage and signal ground. The shunt configuration enables to use the MMIC Doherty amplifier in a wide frequency range. At least some of the inductors of the input network and/or output network are implemented using bond wires. Their orientations and locations provide minimal mutual electromagnetic coupling between the wires and the return RF current paths.

11 Claims, 8 Drawing Sheets

(402) $C_{add} = 1/(\omega_0^2 L_i) + 1/(\omega_0 Z_0) - C_{ds}$ (404) $F_0 = 1/(2\pi \sqrt{L_i [C_{add} + C_{ds}]})$

INTEGRATED DOHERTY AMPLIFIER

FIELD OF THE INVENTION

The invention relates to an electronic circuit with a Doherty amplifier.

BACKGROUND ART

As known, a classical Doherty amplifier has two amplifying devices arranged in parallel and of the same power capability. The first one of the devices (main stage) operates in a class-AB amplifier mode and the second one (peak stage) operates in a class-C amplifier mode. These devices are separated at their inputs and at their outputs by 90° phase-shifting networks. The output phase-shifting network has a specific characteristic impedance $Z_0$ which must be equal to the optimal load impedance $RL_m$ of the main stage. The input signal is split so as to drive the two amplifiers, and a summing network, known as an "impedance inverter" or a "Doherty combiner", is operative to: a) combine the two output signals, b) to correct for phase differences between the two output signals, and c) to provide an inverted impedance at the output of the Doherty amplifier with respect to the impedance as seen from the output of the main stage. While the Doherty input power level stays below 0.25 of the maximum (or: 6 dB below maximum) the peak stage remains inactive. Due to the impedance inversion, the main stage operates at load, which is two times higher than the optimal load and equal to $RL_m = 2 Z_0$. This allows higher power efficiency of the main stage, and also of the Doherty amplifier. The double load at the output of the main stage is possible at proper arrangement of the output load $RL_D$ of the Doherty amplifier which, for the classical case, is $RL_D = \frac{1}{2} Z_0 = \frac{1}{2} RL_m$ and which is transformed by the output phase-shifting network to $2Z_0 = 2RL_m = 4RL_D$. When the input signal to the Doherty amplifier achieves a certain power level, which is 6 dB below the peak power level for a classical Doherty amplifier, the output voltage of the main stage reaches the maximum RF voltage amplitude resulting in maximum power efficiency and then the peak stage is activated and takes over the amplification. Above this threshold power level, the load impedance as seen by the main stage starts to drop gradually with growing power level until it reaches its optimal value $Z_0$, which occurs at the peak power level of the Doherty amplifier.

Doherty amplifiers are discussed in, e.g., US patent application publication 20050231286, and U.S. Pat. No. 6,356,149, both incorporated herein by reference.

A Doherty amplifier is a very attractive candidate for integration in a semiconductor device, due to its simplicity and due to the fact that its operation is involving only an analog-signal processing technique. But this comes at a cost: the development of a Doherty amplifier requires very precise design and presents a real challenge even to highly experienced designers of RF (radio frequency) circuitry. The electrical parameters of the components involved in the Doherty amplifier, e.g., ceramic capacitors and their positions on the printed circuit board (PCB), must be precisely defined at tolerances, which are much smaller than those required for traditional power amplifiers. Also, due to mechanical tolerances, the ground contacts of the main stage and of the peak stage packages, and their positions between the input micro-strip lines and output micro-strip lines of the PCB, are not reproducible precisely enough and add to the phase shift inconsistency between the two amplification branches. As a result the accuracy of the values of the Doherty amplifier parameters is adversely affected and this causes a low yield at the production line. This problem can be handled in several ways. The first traditional one is the tedious tuning of the Doherty amplifiers at the production line, which takes time and highly experienced electrical engineers and personnel, and is therefore costly. The second solution is precise designing involving good electrical modeling and implementation with components having low tolerance, which also increases production cost. Accordingly, if integrated, the problems related to the electrical and mechanical tolerances as mentioned above will be reduced, and the advantages of a Doherty amplifier reside in a more consistent performance and a lower price in mass production. Then, the quality of an integrated Doherty amplifier mainly depends on a proper design minimizing the parameter spread of the components used and on the parasitic electromagnetic coupling between its components.

The very general requirements for guaranteeing a proper Doherty performance is a precise input power control that involves the control of the amplitude and phase of the input signals as supplied to the main stage and the peak stage. This turns out to be complicated as a result of the non-linearity of the peak stage, operating as a C-class amplifier, that may be characterized as the power dependence of the input impedance and the output impedance. The dependence of the input impedance on the power requires an adequate design of the input network, or a good isolation between the input port of the main stage and the input port of the peak stage. A hybrid coupler is generally used for this reason. Such a hybrid coupler, however, made by means of distributed transmission lines or by means of lumped capacitor and inductor elements, is difficult to implement in an MMIC (Monolithic Microwave Integrated Circuit) owing to the lack of space required and typically also to the properties of the semiconductor substrate causing high power-losses as in, e.g., Si LDMOS (Laterally Diffused Metal-Oxide Semiconductor) technology.

FIG. 1 is a circuit diagram of a known Doherty cell 100 manufactured in an LDMOS process. Such a cell can be used as a building block to create a high-power Doherty amplifier by means of an array of such cells arranged in parallel. Cell 100 comprises a main amplifier 102 and a peak amplifier 104 arranged in parallel between an input 106 and an output 108. Input 106 is coupled to the input of main amplifier 102 via an input network comprised of a capacitance 110, an inductance 112 and a capacitance 114. Input 106 is coupled to the input of peak amplifier 104 via an input network comprised of an inductance 116, an inductance 118 and a capacitance 120. The output of main amplifier 102 is coupled to output 108 via an output network comprised of a capacitance 122, and inductance 124 and a capacitance 126. Capacitances 122 and 126 are formed by the parasitic drain-source capacitance $C_{ds}$ of amplifier 102 and of amplifier 104, respectively.

Integrated Doherty amplifiers made with current semiconductor technologies are well suited for use in mobile communication devices in the frequency ranges of PCS (Personal Communications Service), operating in the 1900 MHz range and W-CDMA (Wideband Code Division Multiple Access) located in the 1.8 GHz-2.2 GHz range. This can be seen by considering the low-pass C-L-C output network of capacitances 122 and 126 and inductance 124. This output network is used as output combiner of an integrated symmetrical Doherty amplifier. A well-known basic requirement for a Doherty output network is that it provides the functionality of a quarter-wavelength transmission line of a specific characteristic impedance $Z_0$. The value of $Z_0$ is chosen to be the optimum load resistance $R_0$ of the main amplifier stage of the Doherty amplifier. The lumped C-L-C network is equivalent to an impedance inverter. This requires that the capacitance value $C_{ds}$ and the impedance value L be as given in expression (202) of FIG. 2, wherein ω is the angular frequency. For operating in the GHz ranges, a Doherty amplifier is made in a suitable semiconductors technology, e.g., LDMOS. For example, in LDMOS, the supply voltage $V_{ds}$ is around 28 V-32V; for the selected size of the main stage device the value of the parasitic drain-source capacitance $C_{ds}$ equals 1.86 pF with a maximum drain current $I_d$ of 1.2 A; and the knee voltage $V_k$ is 4V. The optimum load resistance $R_O$ is then 40 Ohm according to expression (204). The operating frequency $f_o$ is given by expression (206) and lies around 2 GHz. The inductance value L needed is given by expression (208) and equals 2.95 nH for 2.14 GHz, and slightly more at 1.8 GHz. In an example embodiment, inductances 112 and 118 of the input network are integrated in the silicon substrate, and inductances 116 and 124 are formed with bonding wires.

Accordingly, for applications in the 2 GHz range, such as PCS and W-CDMA, this implementation of a Doherty amplifier can be used in Si-LDMOS. However, for other frequency ranges, such as 1 GHz and WiMax (Worldwide Interoperability for Microwave Access) for the bands of 2.5 GHz-2.7 GHz and 3.4 GHz-3.8 GHz, this Doherty amplifier is not suitable.

SUMMARY OF THE INVENTION

In order to modify the design of cell 100 for operation in these other frequency ranges, the inventor proposes that the following should be taken into consideration. A first consideration relates to the fact that the highly-doped silicon substrate used in LDMOS does not allow creating integrated high-quality inductances. Typically, a quality factor (Q-factor) of around 6 is attainable at a frequency of 2 GHz. Such inductances introduce losses that directly affect the gain of an integrated Doherty amplifier. A second consideration relates to the fact that bond pads, arranged on highly doped substrate, introduce parasitic capacitances and also signal losses. So, if an inductance is needed where more than one bond wire is required with intermediate bond pads, then a non-desired impedance transformation or a phase-shift will occur, and also additional signal losses will be introduced in such an inductance. As a result, the CLC transmission line and Doherty amplifier performance will degrade. A third consideration relates to the belief that an integrated Doherty amplifier device is going to be commercially successful only if the device outline is similar to that of traditional class-AB devices. That is, the integrated Doherty device is preferably to have a similar style of packaging. As a result, however, the useful area (silicon real estate) for the internal configuration of the Doherty device is the same as that for traditional amplifiers, which have a much simpler equivalent electrical schematic. This constitutes a genuine challenge to the designer, as in general a Doherty amplifier requires many more components for its implementation than the traditional AB-class and A-class RF power devices.

These considerations represent a contradiction. On the one hand, integrated inductances are to be replaced by bonding wires in order to avoid power losses. On the other hand, the space or volume for accommodating the configuration is very limited, as a result of which a plurality of bonding wires, belonging to different parts of the Doherty amplifier and carrying different currents with arbitrary amplitudes and phases, are to be arranged close to one another. This implies that these bonding wires will inevitably be coupled to each other by magnetic fields, thereby seriously hampering the Doherty operation. Therefore, the Doherty device for the best performance should involve a minimum number of components that must be arranged so that a harmful magnetic coupling is zero or at least minimized.

The inventor proposes the following approach to solving the problem. One measure is to modify the input network of the Doherty amplifier by removing some components from the active LDMOS die and put them onto another substrate, and/or to eliminate some components altogether, in order to free up space on the LDMOS die. This allows to decrease the loss of signal and to free up space on the LDMOS die so as to make the layout less dense. Another measure is to design the layout, bond wire arrangement, bond wire location, and bond wire orientation so as to reduce or eliminate the harmful electromagnetic coupling between components of the network.

More specifically, the invention relates to a circuit as specified by claim 1. The (parasitic) output capacitance of the main stage device itself does not meet the condition of equation (202) discussed above, for use of the Doherty at higher frequencies (e.g., above 2.2 GHz). The addition of the shunt capacitance to the output of the device increases the total capacitance at the output of the main stage even further, but adding the shunt inductance enables to compensate for the change in the output impedance in a measured way. As a result, the Doherty of the invention becomes highly tunable over a wider range of frequencies. Also, this network provides another new valuable functionality to the Doherty amplifier if the shunt inductance is connected to signal ground via a further capacitance, the combination operating as a so-called "inshin" (inserted shunt inductance) network. If a power supply is connected between the shunt inductance and the RF grounding capacitance, electrical memory effects are improved in a wide modulation frequency band (also referred to as "video band" or "base band."

The so-called "electrical memory effect" reveals itself as additional inter-modulation distortions of the amplified signal. The effect stems from the non-constant voltage of the power supply at the drain of the power device, which happens at peak power levels. The reason for that is a large value of "choke" inductance, or quarter wavelength transmission line, which is traditionally used for connecting the device's drain to the closest capacitor of the DC power supply. This inductance or transmission line isolates the RF signal path from the DC supply path, and in fact operates as a low-pass filter. If an RF signal is not modulated and has constant or non-variable amplitude (or a constant RF envelope), then the requirements imposed on the choke inductance are somewhat relaxed. The choke inductance can be large, providing a very high impedance looking into the DC power supply path and, as a result, low losses of the RF signal. But if the modulated signal is amplified, then the value of the choke inductance is limited by two contradictory requirements. On the one hand, the inductance must be large enough to provide a high impedance to the amplified RF signal. Typically, the impedance should be larger by two orders of magnitude than required for the RF signal path to allow less than 1% of efficiency loss. On the other hand, this inductance must be small enough to provide minimal impedance for the highest frequency of the spectrum of the modulation signal, typically smaller than 0.3 Ohm at 100 MHz modulation frequency for a 100 W device, to avoid the variations of the power supply voltage at the device's drain. With the traditional way of connecting the device to the DC power supply through an inductance or by a quarter-wave length transmission line, this requirement can be met only at 20-40 MHz at the highest, and this is well below the requirements for a WiMAX communication system. The reason for that is that the choke inductance is too large (at least several nano-Henry). The situation can be resolved if an INSHIN-inductance is used as choke, as a result of which the DC power supply can be connected to a capacitor used in the INSHIN device as a grounding. The INSHIN-, or compensation-, inductance is typically about 0.25 nH for a 100 W device, and is in general several times smaller than the minimal possible traditional choke inductance of 3-4 nH. This allows to minimize the electrical memory effects even at 100 MHz of the modulation signal.

An embodiment of the circuit of the invention is specified in claim 2. The components are distributed over multiple substrates. One of the substrates accommodates the main stage and peak stage, and can be optimized under the Si LDMOS technology design rules. The other substrates can be made in a simpler technology, e.g., MOS. The interconnections between the substrates are realized using bond wires. These bond wires themselves are also used as inductances of the input network and output network. Lengths of the wires can be well controlled, and thus the inductance values can be well tuned.

Preferably, an inductance made with bond wire uses a back-and-forth configuration of multiple parallel bond wires, wherein currents in neighboring bond wires run in opposite directions. This reduces the magnetic field generated by the inductance as felt by other electronic components of the Doherty amplifier. This approach also provides a minimizes the area occupied by the return RF current paths and, as a result, reduces the mutual coupling or interference with the surrounding components.

Preferably, different inductances are implemented with bond wires that connect different nodes in the input network and/or in the output network. Those that are close to one another are positioned in different orientations, e.g., perpendicular to one another. This minimizes the electromagnetic coupling between these inductances.

Other advantages of the integrated Doherty amplifier of the invention lay in potentially better performance than traditional solutions: a) a higher reliability due to better conditions for power dissipation at the main device, due to the arrangement wherein the hot main device is located between cooler peak devices, b) higher efficiency due to a better access to the main power device and easier implementation of high-efficiency techniques such as F-class, or E-class operation, c) better linearity due to direct access to active device technology and opportunity of appropriate tailoring of the parameters of the main stage and of the peak stage, d) larger instant operational frequency band, e) fewer or less severe electrical and temperature memory effects.

As mentioned above, the quality of an integrated Doherty amplifier is mainly due to high consistency and minimal parameter spread of the integrated components. Performance, however, entirely depends on a proper choice of the electrical schematic and of the very well defined layout of the design, which must take into account all features and limitations of the MMIC technology used. As a matter of fact, there are just a few possible designs and topologies for an integrated Doherty amplifier that realize the benefits of Doherty amplification technique.

A further design option relates to using a peak stage that is larger than the main stage. Another design option relates to making a large-scale Doherty device by having a plurality of Doherty amplifiers according to the invention arranged in parallel so as to form an array. The inputs of the Doherty amplifiers are combined at the input lead of the package and the output of the Doherty amplifiers are combined at the output lead of the package. This then enables to create an attractive amplifier device for use in high-power (e.g. 150 Watt) applications.

BRIEF DESCRIPTION OF THE DRAWING

The invention is explained in further detail, by way of example and with reference to the accompanying drawing, wherein.

Throughout the Figures, similar or corresponding features are indicated by same reference numerals.

DETAILED EMBODIMENTS

When modifying the design of cell 100 for operation in these other frequency ranges, the following should be taken into consideration. A first consideration relates to the fact that the highly-doped silicon substrate used in LDMOS does not allow creating integrated high-quality inductances. Typically, the best quality factor (Q-factor) of around 6 is attainable at a frequency of 2 GHz. At all other frequencies, above or below, the quality factor is lower. Such inductances in the input network introduce direct losses that directly affect the gain of an integrated Doherty amplifier. In the output network, such integrated inductances will also affect the gain, as well as power capability and efficiency.

A second consideration relates to the belief that an integrated Doherty amplifier device is going to be commercially successful only if the device outline is similar to that of traditional class-AB devices. That is, the integrated Doherty device is preferably to have a similar style of packaging. As a result, however, the useful area (silicon real estate) for the internal configuration of the Doherty device is the same as that for traditional amplifiers. This constitutes a genuine challenge to the designer, as in general a Doherty amplifier requires many more components for its implementation than the traditional devices.

These considerations represent a contradiction. On the one hand, integrated inductances are to be replaced by bonding wires in order to avoid power losses. On the other hand, the space or volume for accommodating the configuration is very limited, as a result of which a plurality of bonding wires are to be arranged close to one another. This implies that these bonding wires will inevitably be coupled to each other by magnetic fields, thereby seriously hampering the Doherty operation. Therefore, the Doherty device for the other frequency bands is to involve a minimum number of components that must be arranged so that a harmful magnetic coupling is minimized.

The invention provides an integrated Doherty amplifier having a guaranteed optimal performance as a result of careful considerations of the design arrangement with respect to the electrical configuration, and of the location and orientation of bond wires relative to one another in the layout.

Figures 1, 2:
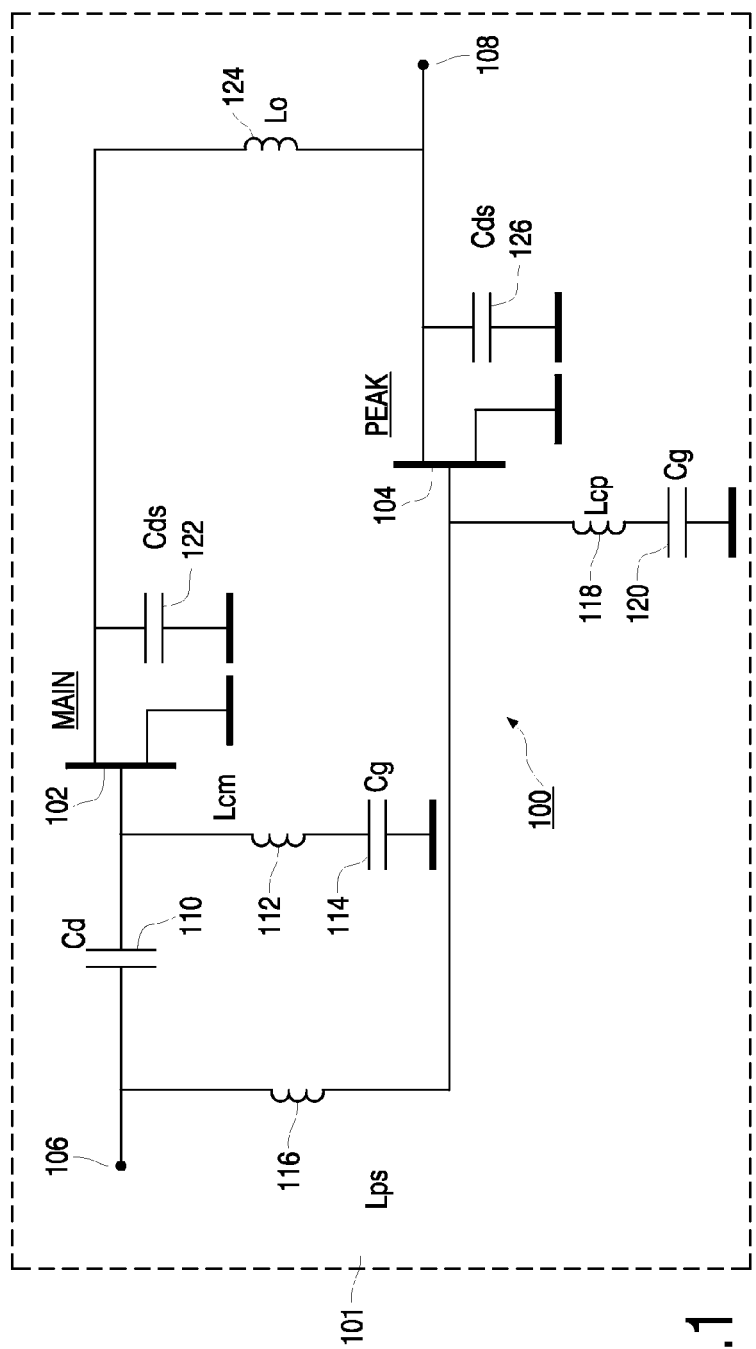
FIG. 1 is a circuit diagram of known Doherty amplifier.
FIG. 2 gives formulae explaining some operational aspects of the Doherty amplifier.
Figures 3, 4:
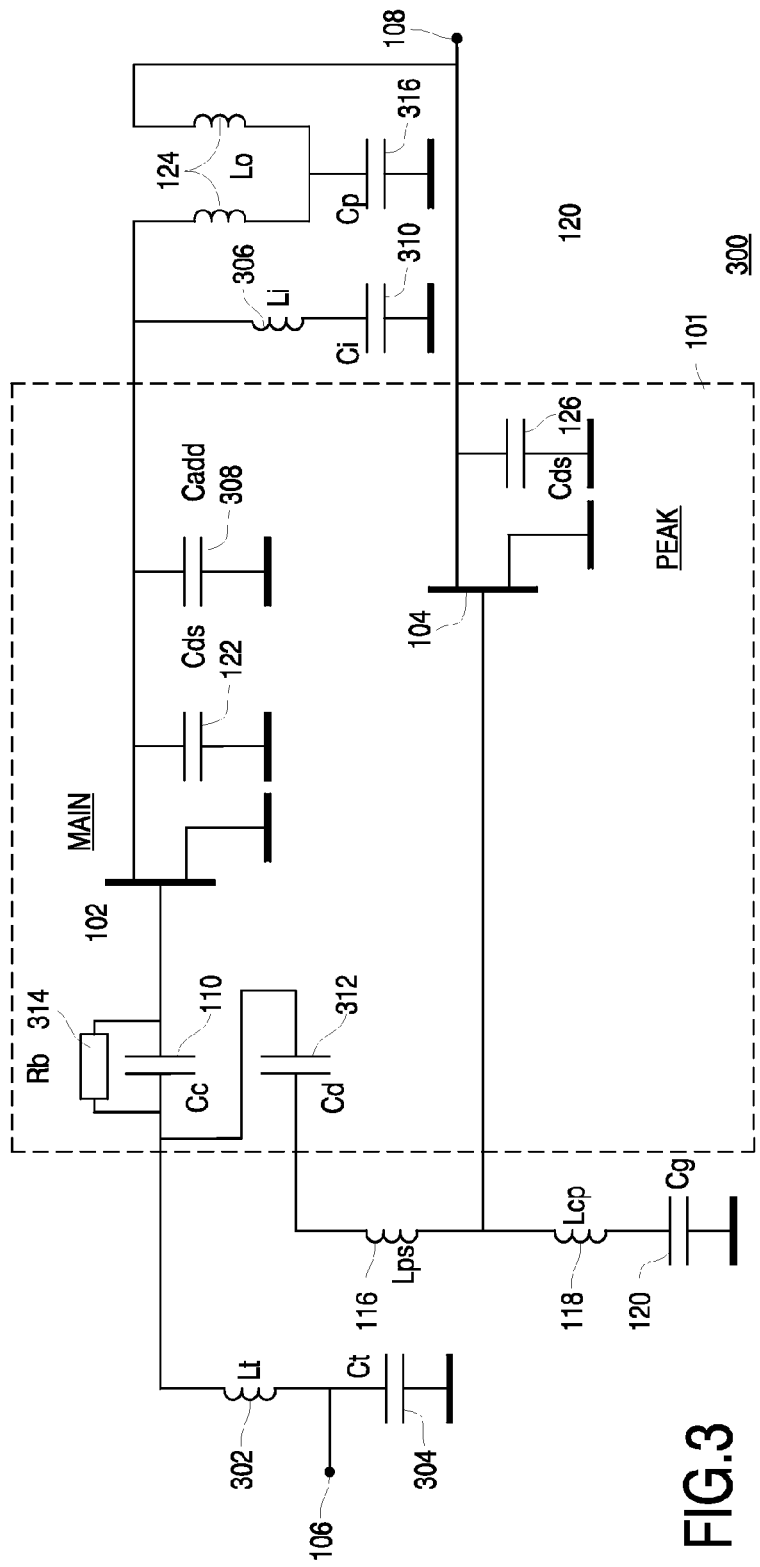
FIG. 3 is a circuit diagram of a Doherty amplifier of the invention.
FIG. 4 gives formulae explaining some details of the Doherty amplifier in the invention.

FIG. 3 is a circuit diagram of a Doherty amplifier 300 in the invention. With regard to Doherty amplifier 100 of FIG. 1, the inventor proposes following modifications: the electrical configurations of the input network and of the output network are changed; some components are moved off semiconductor die 101, and bond wires are used as inductances. Also losses of about 2.5 dB are removed from the Doherty input, which directly results in a 2.5 dB gain improvement. The role of the removed components can be transferred to an LC low-pass transformation network, formed by an inductance 302 and a capacitance 304 at the input of Doherty die 101, using a bond wire as inductance 302 and an MOS capacitor of smaller value for capacitance 304. As result impedance transformation to the desired value in the range of up to 150 Ohm can be achieved. This also guarantees low input power losses. In general, field effect transistors (FETs), used in the implementation of main stage 102 and peak stage 104, are unstable at low frequencies owing to the very high gain of up to 40 dB. Therefore, the input network of Doherty amplifier 300 comprises a resistor 314. Resistor 314 serves to bypass capacitor 110 so as to enable a bias voltage to be applied to the gate of main device 102. Resistor 314 further supports the suppression of low-frequency oscillations. Furthermore, the parallel arrangement of capacitance 110 and resistor 314 allows convenient control of the input power of main device 102, related to the power delivered to peak device 104, in a wide frequency band by means of properly selecting their capacitance value and resistance value. A capacitance 312 serves to separate the gates of main device 102 and of peak device 104 in the role of a DC block. This enables to bias main device 102 and peak device 104 independently. Capacitances 110 and 312 only require little room on active die 101. They further represent low RF losses due to the high quality-factor at high frequencies.

The simple CLC network, formed by components 122, 124 and 126 can be used as the Doherty's output network in the 2 GHz range, such as for PCS and W-CDMA. As already mentioned above, the Doherty amplifier is to be modified when employed in other frequency ranges, such as 1 GHz and WiMax for the bands of 2.5 GHz-2.7 GHz and 3.4 GHz-3.8 GHz.

Due to the fact that the drain-source internal capacitance 122 (i.e., the output capacitance of amplifier 102) is too large for use as a C component of a CLC Doherty combiner at frequencies above 2.2 GHz, the inventor modifies the output network. It would be beneficial for the operation of the output network if the output impedance of main amplifier 102 could be modified according to the need. A very robust solution is to add a shunt inductance 306 and a capacitance 308. This enables not only to properly tune the output impedance of amplifier 102, but also to add new functionality, thereby improving the quality of amplifier 102 with respect to electrical memory effects. A capacitor 310 in series with inductance 306 is arranged to allow only an RF current to flow through inductance 306, and prevents a DC current to flow from the supply to ground, but does not substantively affect the output impedance of main amplifier 102. In effect, the arrangement of inductance 306 and capacitor 310 functions as a compensation (or: inshin) network.

Inductance 124 has been drawn as connected in the middle to ground via a capacitance 316. As is shown below, inductance 124 is implemented in specific embodiments as comprising two bond wires that are connected via a bond pad having a parasitic capacitance. Capacitance 316 represents this parasitic capacitance. The harmful effect caused thereby can in general be minimized by means of using an appropriate substrate with low losses and low dielectric constant. However, capacitance, if very large, can be used also as a part of the phase-shifting LCL network, which has properties similar to those of a CLC network. In this case, only the required parameter values of these output network components are different.

The value of capacitance 308 is given in expression (402) in FIG. 4, wherein $C_{ds}$ is the output capacitance of device 102, and wherein $L_t$ is the value of shunt inductance 306. Preferably, inductance 306 is realized through a one-step bond wire. The resonance frequency $f_o$ of device 102 is then given by expression (404) in FIG. 4.

Another way of looking at the modification of the output network is the following. Capacitance $C_{ds}$ is too large to be used for frequencies above 2.2 GHz. The capacitance at the output of device 102 is increased even further by way of adding capacitance 308, thus further making the usable frequency even lower. However, adding shunt inductance 306 compensates for this negative effect so as to pull the usable frequency back again into the higher ranges. In fact, this arrangement allows the same active Doherty die to be used for different frequency bands by means of tuning the value of inductance 306. This can be simply accomplished by changing the length of the bond wire, thus further reducing the costs of an integrated Doherty amplifier according to the invention, due to the re-use of the same die, and a new design is not required.

In order to implement this and other modifications, the inventor further proposes a few design re-arrangements in order to provide the desirable Doherty performance within a compact volume of a discrete RF power device package. Preferably, as few components as possible are arranged on active die 101. The remaining components are arranged appropriately outside active die 101, thus allowing the use of other substrate materials, e.g., less expensive than, and with electrical and mechanical characteristics different from, active die 101. This leads to more flexible design conditions, lower cost, and better performance of an integrated Doherty amplifier. For example, capacitances 304 and 310 are created as low-cost MOS capacitors that have in general a better quality than MIM (metal-insulator-metal) capacitors made within the MMIC process. Inductances, e.g., inductances 116, 124, 302 and 306 are preferably made with bond wires, as bond wire implementations are very-low cost and have a very good quality factor. In addition, inductances made of bond wires have a very high value (typically 15 GHz) of the self-resonance frequency. Various example designs are discussed below with reference to FIGS. 5-10. However, these inductances 116, 124, 302 and 306, may be implemented as integrated if the properties of substrate 101 allow high quality, low losses and small parasitic elements.

Figure 5:
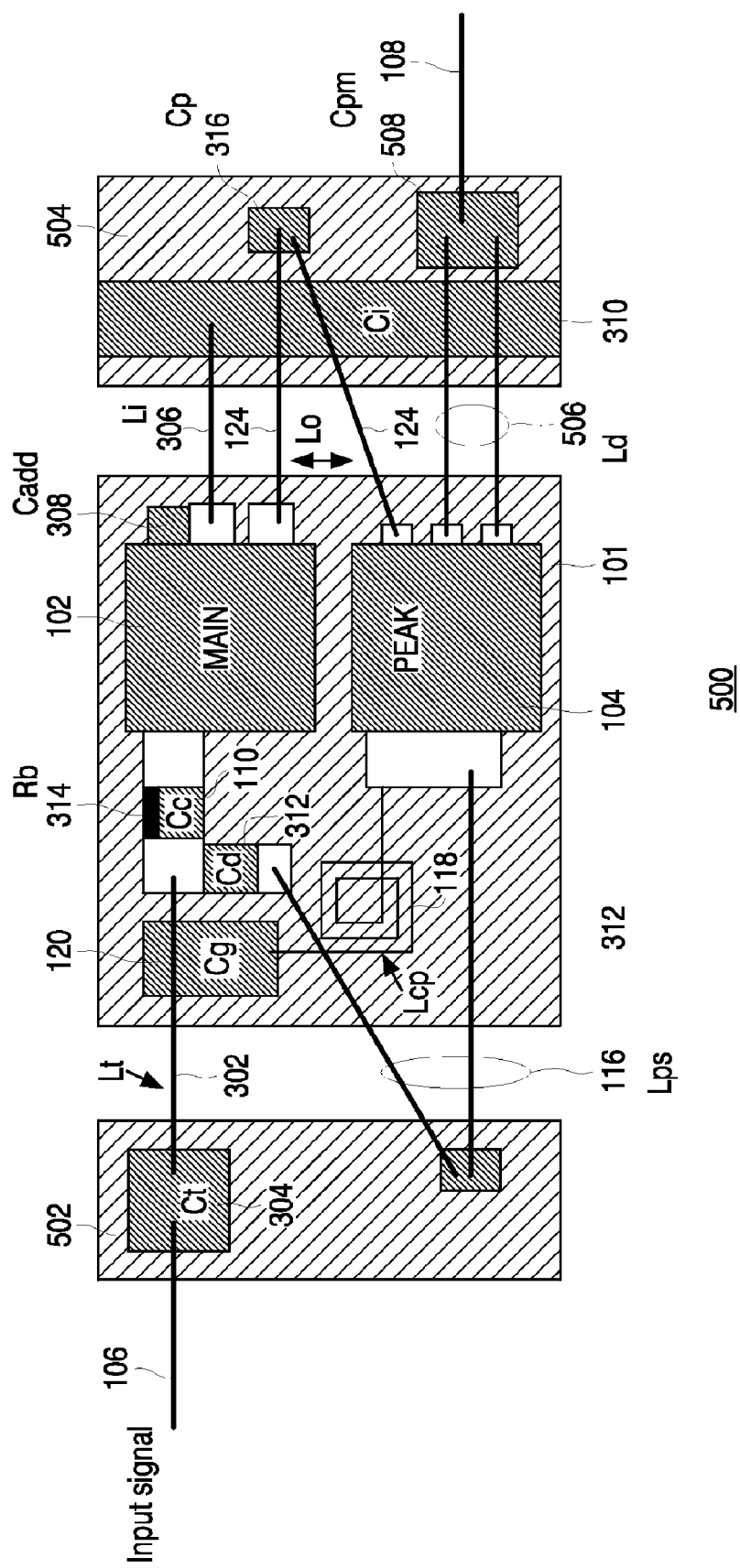
FIGS. 5-10 give design examples of a Doherty amplifier in the invention.

FIG. 5 is a first example of a design configuration 500 of circuit 300 of FIG. 3. Herein, components of circuit 300 have been created in conventional substrates 502 and 504 that are used for e.g., MOS circuitry. Inductances 116 and 124 are made as two parallel back-and-forth bond wires. This avoids high return-currents flowing through the ground plane beneath, and keeps magnetic fields very compact. This configuration also minimizes the magnetic coupling to other components of the Doherty amplifier, e.g., between inductances 116 and 302. Also, inductance 302 made as a bond wire and capacitance 304 made as an MOS capacitor give rise to a low-cost implementation. These components provide the required impedance transformation and matching to the signal source with minimal signal loss. In a current LDMOS technology, die 101 in configuration 500 has typical dimensions of 1.2 mm by 1.2 mm. Bonding wires 506 connect the combining point of main device 102 and of peak device 104 to output 108 and form an inductance. A capacitance 508 is used as a post-match capacitor Cpm. Note that inductances 306 and 124 are oriented more or less in the same direction. However, the coupling between inductances 306 and 124 is low for practical applications owing to the 90° phase difference (or: orthogonality) between the currents in the bond wires. This configuration does therefore not degrade the Doherty performance.

As to return currents, as a matter of fact, all RF-circuits are characterized by their Return Current Paths (RCPs). The RCP indicates the route via which an RF-current returns to the source of the RF signal. In the same way all RF-components can be characterized too. All RF integrated components have a very compact RCP or "footprint" on the ground plane. This means that in integrated circuits these footprints do not overlap. That is why integrated components can be arranged very close to each other, without the danger of mutual coupling. If bond wires are used in RF circuitry, the RCP can be very wide, and in general the area occupied by the RCP is proportional to the loop height of the bond wire. This means that closely standing wires are coupled not only by magnetic field through the air, but also by their footprints. If currents in the ground plane have similar directions and orientation, then the coupling is positive, and if they have opposite directions then the coupling is negative. Now, an orientation of two bond wires that is different from a parallel arrangement, affects the coupling between the wires and their RCP footprints. Choosing an orientation substantially perpendicular or even having crossing wires with different loop heights minimizes the coupling, not only through the magnetic field in the air, but also in the ground plane. Another way to make compact magnetic fields and to minimize RCP is to use two bond wires arranged in parallel close to each other and connected at one side by the same bond pad. In this case, the wires have equal currents flowing in opposite directions. This option is used for inductances 116 and 124 in the designs described with reference to FIGS. 5-9.

Figure 6:
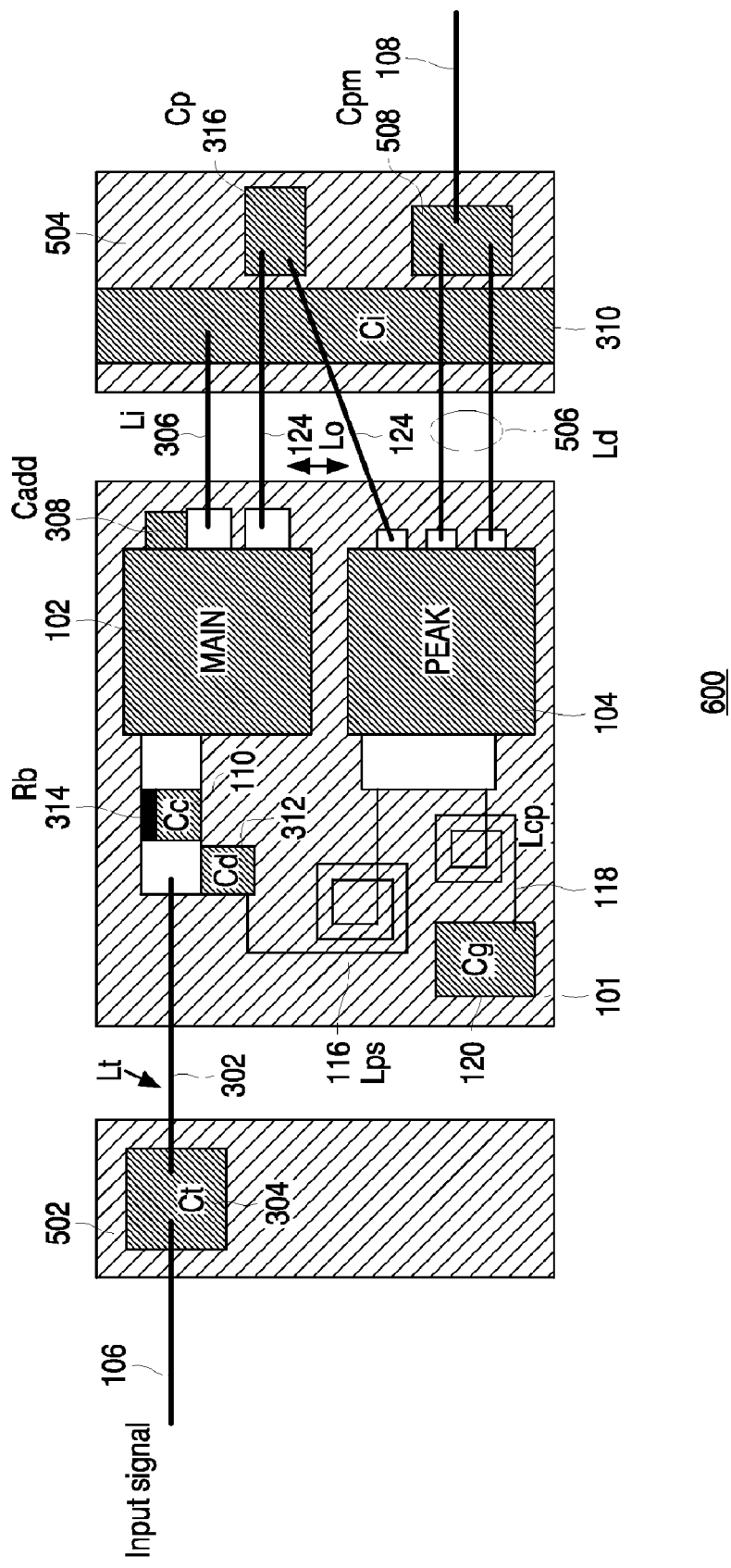

FIG. 6 is a second example of a design configuration 600 of circuit 300 in FIG. 3. Configuration 600 is suitable for the cases, wherein substrate losses are not very high, and wherein the Q-factor of the integrated inductances is larger than 20. In configuration 600, inductance 116 is integrated on the active die 101. Configuration 600 has advantages over configuration 500 in the improved consistence of the product due to the complete integration of the input network. Configuration is also more beneficial than configuration 500 if the magnetic coupling between inductance 116, made of bond wire, and other components of the Doherty amplifier is too large and hampers Doherty performance. In a current LDMOS technology, die 101 in configuration 600 has typical dimensions of 1.6 mm by 1.2 mm.

Figure 7:
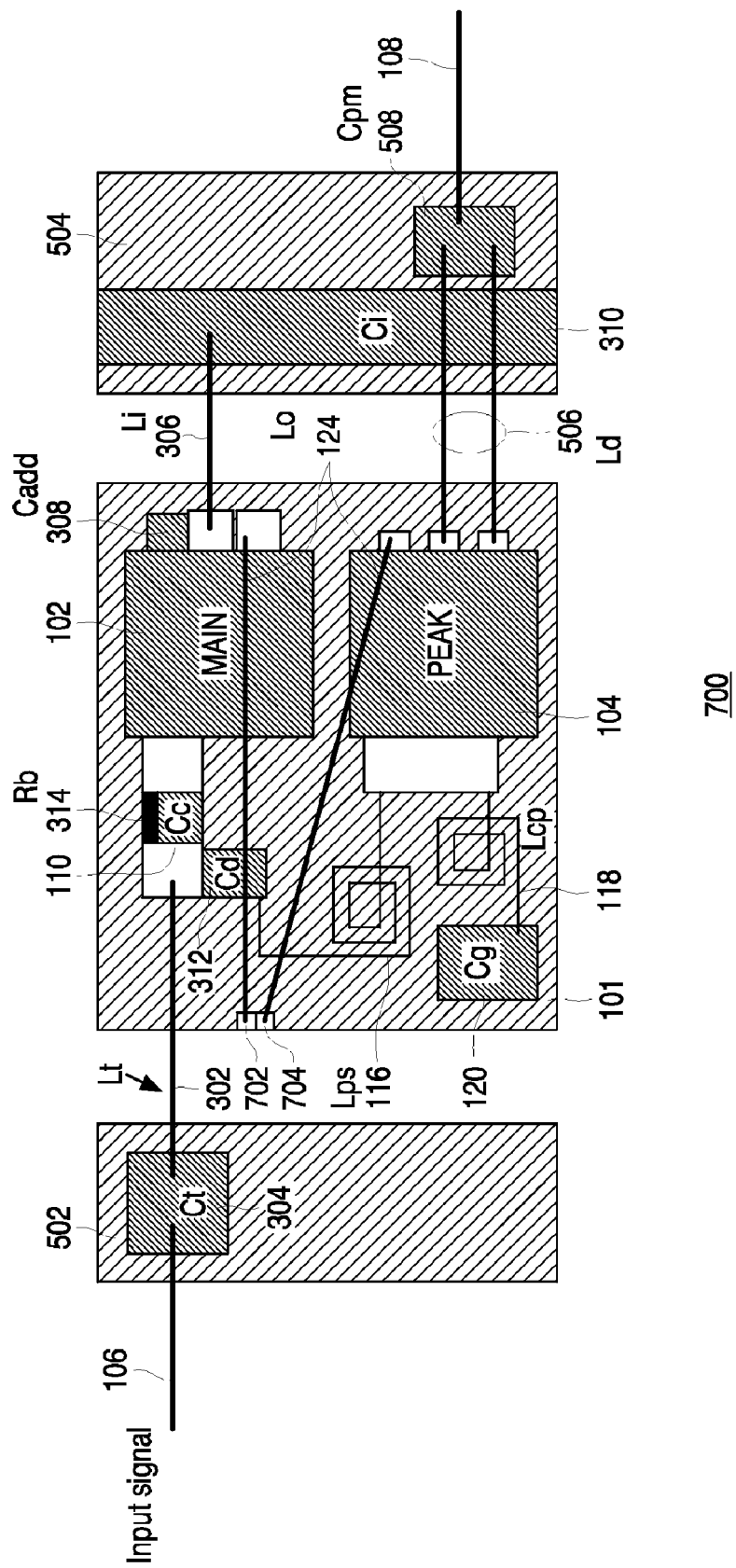

FIG. 7 is a third example of a design configuration 700 of circuit 300. Configuration 700 is addressed to the cases wherein substrate losses are acceptable and also the magnetic coupling between inductance 306 and inductance 124 is too high with a negative effect on the overall Doherty performance. Here, inductance 124 is made of bond wires, and arranged in backwards direction with bond pads 702 and 704 located on active die 101. This configuration facilitates using the inshin inductance 306 and capacitance 310. Inductance 306 is made of a bond wire between active die 101 and capacitance 310, the latter being implemented on substrate 504 as an MOS capacitor. Configuration 700 minimizes the magnetic coupling between inductance 124 and inductance 306 and also inductance 508 as a result of the large distance between them.

Figure 8:
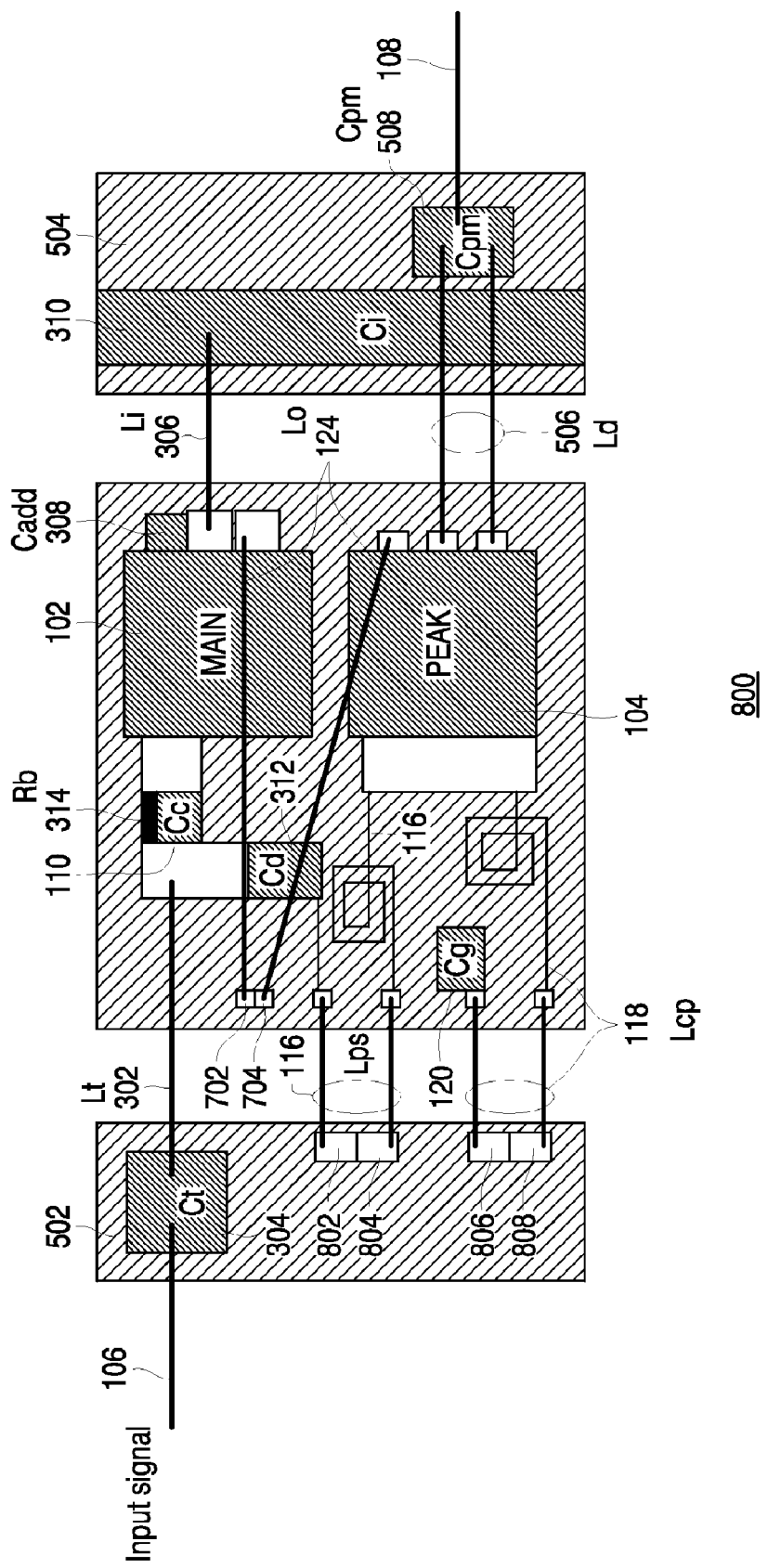

FIG. 8 is a fourth example of a design configuration 800 of circuit 300. Configuration 800 resembles configuration 700 of FIG. 7, but now inductances 116 and 118 have been made partially as integrated on active die 101 (MMIC) and partially as bond wires. Configuration 800 is beneficial for the technology wherein substrate losses are very high and would badly affect the gain of the Doherty amplifier. Note that, in addition, the magnetic coupling between the wires is also minimal as in configuration 700. Substrate 502 accommodating capacitance 304 is now used to also provide bond pads 802 and 804 for interconnecting the bond wires in inductance 116, and bond pads 806 and 808 for interconnecting the bond wires in inductance 118. This arrangement reduces signal loss at the input of the Doherty amplifier and provides more flexibility by means of providing a means to tune the Doherty's input network by adjusting the length of the bond wires in inductances 116 and 118. This represents a great advantage in mass production of Doherty amplifiers in that the Doherty amplifier can be optimized to a particular frequency band within a wider range of frequencies by selecting the bond wire length without the need for redesigning and producing another MMIC die.

Figure 9:
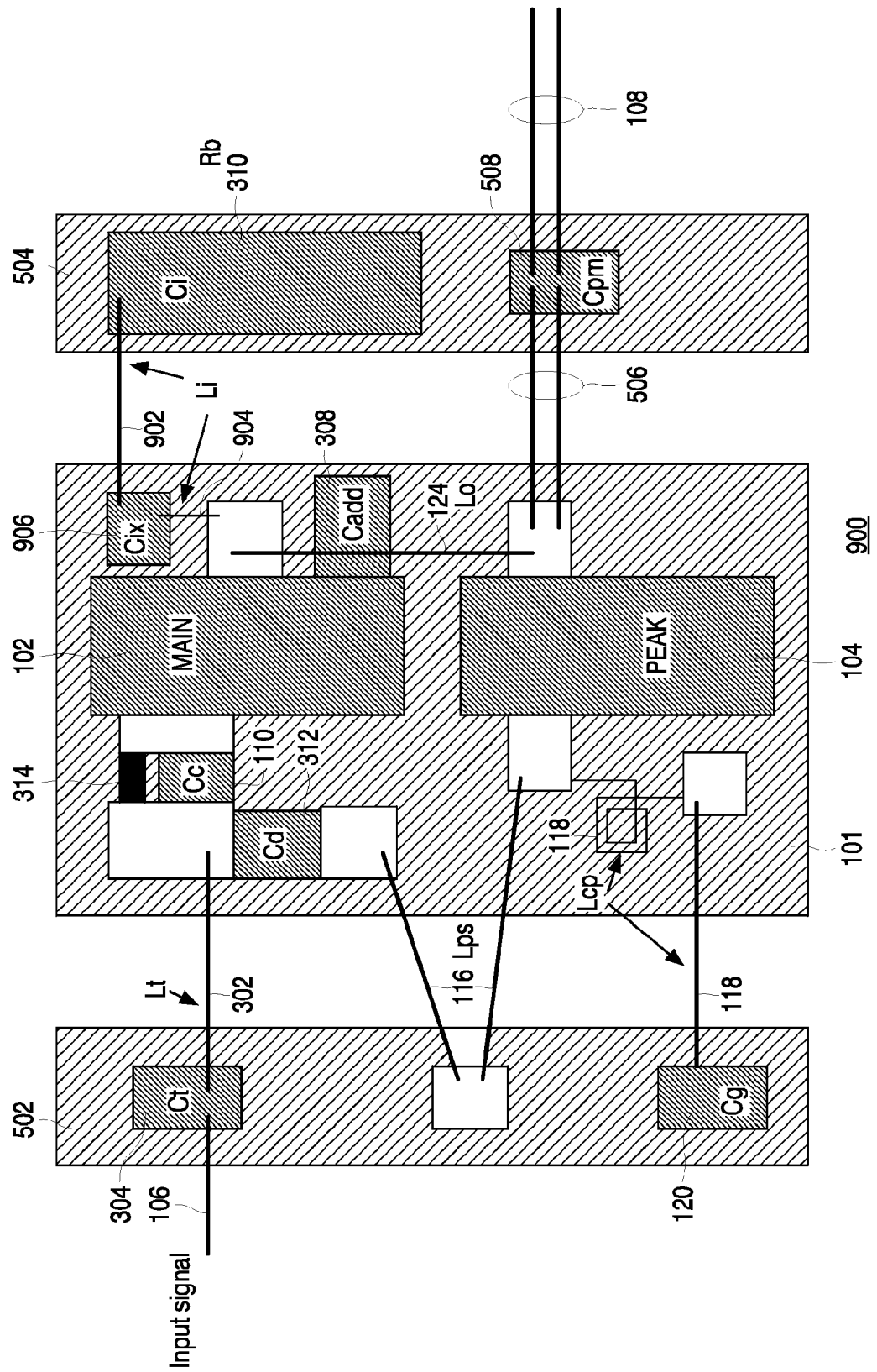

FIG. 9 is a fifth example of a design configuration 900 of circuit 300. Advantages of configuration 900 include the following. At relatively high frequencies, the required value of inductance 124 becomes small and inductance 124 can then be implemented in just a single step. This allows reducing the number of bond pads. In general, bonding pads have a negative effect due to their parasitic capacitance Cp. The orientation of inductance 124 is perpendicular to bond wires 506. As a result, the mutual coupling between inductance 124 and wires 506 is minimal. Also, the RCP of the wires of inductance 124 is perpendicular to the RCP of wires 506 of the output signal, and to the signal path between input 106 and output 108 in general. This eliminates, or at least reduces, interference and improves stability of the Doherty amplifier. Further, the wires of inductance 116 are perpendicular to those of inductance 124, further eliminating a source of undesired coupling. Another advantage is that inductances 124 and 306 of an integrated Doherty amplifier cell are at relatively large distance of the corresponding inductances of a neighboring Doherty amplifier cell in an array formed of such cells arranged in parallel to form a large scale power Doherty amplifying device. This is an advantage when scaling the Doherty amplifier device, as the mutual coupling of neighboring cells is relatively low. Additionally, this solution allows enough space to arrange the inshin circuit in a two-step bond wire with an additional capacitor in the middle. That is, inductance 306 of the previous examples is now formed by bonding wires 902 and 904 interconnected via extra capacitance 906. This network allows controlling or suppressing the second harmonic of the output current. This also allows improving the ruggedness of the device by lowering the output RF voltage amplitude by 15% in the range of more than 6 dB power back-off below the Doherty peak power level. Bondwire 902 is perpendicular to wire 904 and arranged on active die 101 to minimize the negative RCP effect on the second harmonic suppression.

Figure 10:
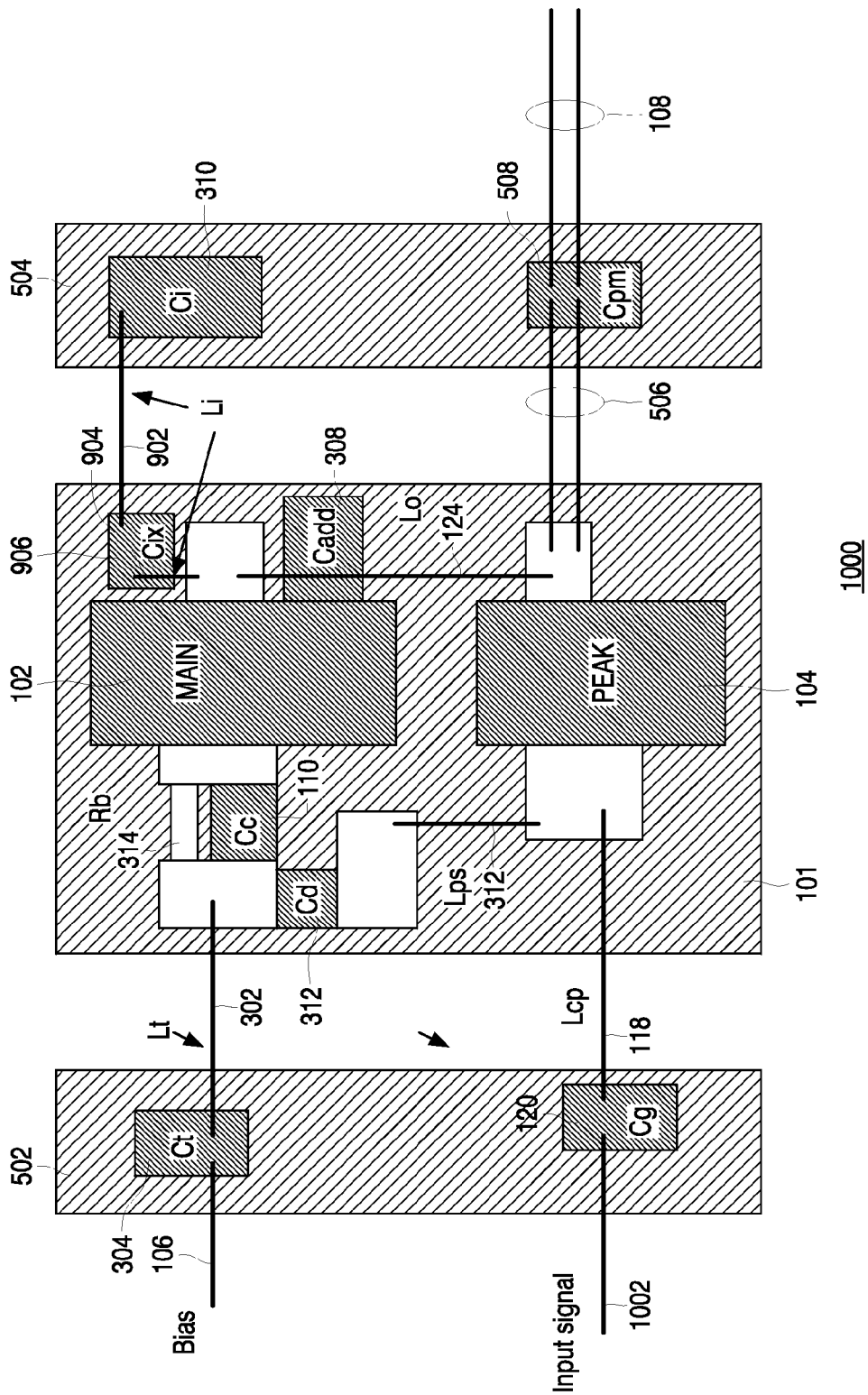

FIG. 10 is a sixth example of a design configuration 1000 of circuit 300. Configuration 1000 provides a solution with a minimum number of components on active die 101. One of the differences with configuration 900 is the point of application of the input signal, now at node 1002. Node 106 is now used to apply a bias voltage. This solution is most beneficial for a technology with very poor Q-factors of integrated inductances, such as LDMOS for use at the 3.7 GHz WiMAX frequency band.

A design issue is that if larger LDMOS transistors are used as main stage 102 and peak stage 104, smaller values are required for inductance 124 and two parallel bond wires can be used to allow larger average RF current to flow through them. For example, consider using an LDMOS transistor, having a 6.5 mm gate width, as main stage 102. Its drain-source supply voltage is Vds=28V and the device needs a characteristic impedance of Zo=40 Ohm. This requires the value of inductance 124 to be Lo=3 nH in order to operate at 2.14 GHz of the WCDMA standard. According to the design rules, implementation of this inductance value requires two bond wires made in two steps with an inductance value of 1.5 nH each. Also this arrangement requires two bonding pads which, if arranged on substrate 504 accommodating the MOS capacitors, would have a parasitic capacitance of 1 pF. This would then result in a degrading of performance of the Doherty's impedance inverter by an excessive 20° phase shift, giving a shift of 110° instead of 90°, and giving a lower characteristic impedance Zo=35 Ohm instead of Zo=40 Ohm. The result would be a lower efficiency, worse linearity and lower gain of the Doherty amplifier. Now, if the main stage LDMOS transistor is one with a twice bigger gate of 13 mm width, then the required value of impedance 124 is 1.5 nH. This can be implemented by means of a one-step bond wire arranged in perpendicular direction, providing minimal parasitic magnetic coupling to the other bond wires and also without intermediate bond pads. In this case, two parallel bond wires are required due to twice larger average output current of main stage 102. This configuration provides virtually an ideal performance of the Doherty's impedance inverter.

The invention claimed is:

1. An electronic circuit comprising a Doherty amplifier, wherein:
   the Doherty amplifier comprises:
   an input, an output, a main stage and a peak stage; and
   an output network connecting an output node of the main stage and an output node of the peak stage to the output;
   the output network comprises:
   a first inductor coupled between the output node of the main stage and the output node of the peak stage;
   a shunt capacitor coupled between the output node of the main stage and signal ground in parallel to a parasitic capacitance of the main stage; and
   a shunt inductor coupled between the output node of the main stage and signal ground, wherein the shunt capacitor and shunt inductor are configured and arranged to compensate for an output impedance of the Doherty amplifier for at least one signal frequency greater than 2.2 GHz.

2. The circuit of claim 1, wherein:
   the input is accommodated on a first substrate;
   the main stage and the peak stage are integrated on a second substrate; and
   the output is accommodated on a third substrate.

3. The circuit of claim 2, wherein:
   the input network comprises a second inductor;
   the second inductor comprises a bond wire between the first substrate and the second substrate; and
   the shunt inductor comprises a further bond wire between the second substrate and the third substrate.

4. The circuit of claim 1, wherein the first inductor comprises a plurality of bond wires, and wherein currents in adjacent ones of the bond wires run in substantially anti-parallel directions.

5. The circuit of claim 3, wherein:
   at least a specific one of the first inductor, second inductor and shunt inductor comprises a plurality of bond wires; and
   currents in adjacent ones of the bond wires of the specific inductor run in substantially anti-parallel directions.

6. The circuit of claim 3, wherein:
   each of the first inductor, the second inductor and the shunt inductor comprises a respective bond wire;
   the bond wires of at least one pair of the first inductor, the second inductor and the shunt inductor have substantially perpendicular orientations.

7. The circuit of claim 2, further comprising a further inductor that is partly integrated in the second substrate and partly implemented with bond wires forming a back-and-forth path between the first and second substrates.

8. An electronic circuit comprising a Doherty amplifier, wherein:
   the Doherty amplifier comprises:
   an input, an output, a main stage and a peak stage; and
   an output network connecting an output node of the main stage and an output node of the peak stage to the output;
   the output network comprises:
   a first inductor coupled between the output node of the main stage and the output node of the peak stage;
   a shunt capacitor coupled between the output node of the main stage and signal ground in parallel to a parasitic capacitance of the main stage; and
   a shunt inductor coupled between the output node of the main stage and signal ground; and
   at least one further Doherty amplifier arranged in parallel with the Doherty amplifier first-mentioned.

9. The circuit of claim 8, wherein the shunt capacitor and shunt inductor are configured and arranged to compensate for an output impedance of the Doherty amplifier for at least one signal frequency greater than 2.2 GHz.

10. The circuit of claim 9, wherein the shunt capacitor and shunt inductor form part of a CLC circuit selected to set the selected frequency.

11. The circuit of claim 1, wherein the shunt capacitor and shunt inductor form part of a CLC circuit selected to set the selected frequency.

* * * * *